United States Patent [19]
Nojo et al.

[11] Patent Number: 6,059,920
[45] Date of Patent: May 9, 2000

[54] SEMICONDUCTOR DEVICE POLISHING APPARATUS HAVING IMPROVED POLISHING LIQUID SUPPLYING APPARATUS, AND POLISHING LIQUID SUPPLYING METHOD

[75] Inventors: Haruki Nojo, Kanagawa-ken; Rempei Nakata, Kamakura; Kiyotaka Kawashima, Yokohama, all of Japan

[73] Assignees: Kabushiki Kaisha Toshiba, Kawasaki; Ebara Corporation, Tokyo, both of Japan

[21] Appl. No.: 08/801,857

[22] Filed: Feb. 19, 1997

[30] Foreign Application Priority Data

Feb. 20, 1996 [JP] Japan ................................... 8-032098

[51] Int. Cl.[7] ............................... C23F 1/02; B24B 57/00
[52] U.S. Cl. .......................... 156/345; 451/60; 451/287; 451/446; 438/692; 438/693
[58] Field of Search ................................. 438/692, 693; 451/36, 37, 41, 67, 285–290, 446, 60, 287; 156/345

[56] References Cited

U.S. PATENT DOCUMENTS

| | | | |
|---|---|---|---|
| 4,688,945 | 8/1987 | Brazelton et al. | 366/156.1 |
| 5,375,378 | 12/1994 | Rooney | 451/38 |
| 5,407,526 | 4/1995 | Danielson et al. | 438/693 |
| 5,478,435 | 12/1995 | Murphy et al. | 438/693 |
| 5,609,417 | 3/1997 | Otte | 366/137 |
| 5,679,063 | 10/1997 | Kimura | 451/287 |
| 5,725,417 | 3/1998 | Robinson | 451/56 |
| 5,750,440 | 5/1998 | Vanell et al. | 438/692 |
| 5,800,251 | 9/1998 | Nakazato et al. | 451/41 |
| 5,857,893 | 1/1999 | Olsen et al. | 451/5 |

*Primary Examiner*—Benjamin L. Utech
*Assistant Examiner*—Donald L. Champagne
*Attorney, Agent, or Firm*—Finnegan, Henderson, Farabow, Garrett & Dunner, L.L.P.

[57] ABSTRACT

The first pipe 34 delivers the first solution 21 containing polishing particles. The second pipe 37, containing a liquid mass flow unit 36, delivers the second solution containing a chemical substance. The outlet port of the first pipe and the outlet port of the second pipe are connected to one end portion of the third pipe 31. The third pipe has the other end portion with an inner diameter almost equal to the inner diameter of its one end portion. The first and second solutions introduced into the third pipe are mixed in the third pipe to generate a polishing liquid. The generated polishing liquid is supplied from the other end portion of the third pipe onto a polishing pad 13 to polish a semiconductor wafer 16.

12 Claims, 3 Drawing Sheets

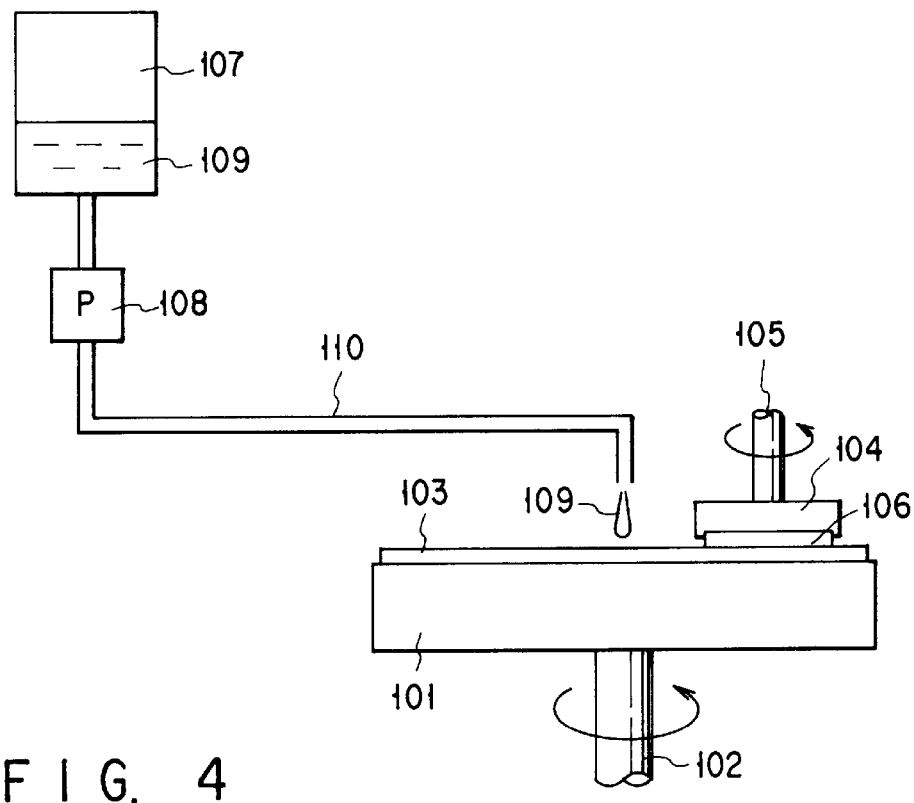
F I G. 4
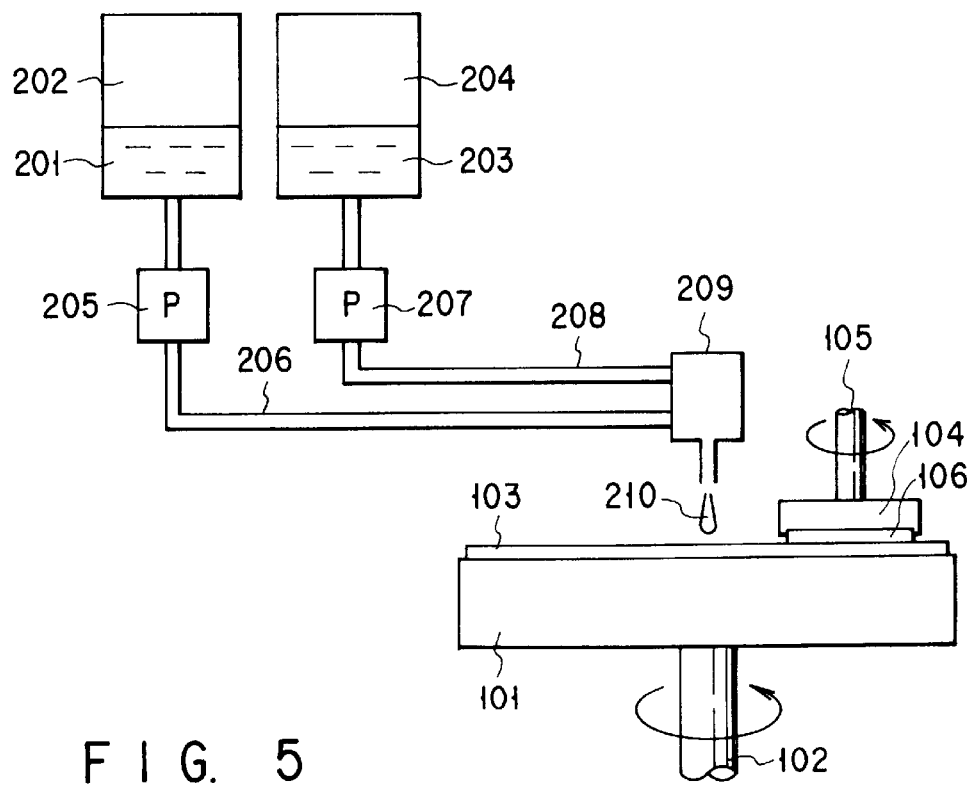
F I G. 5

SEMICONDUCTOR DEVICE POLISHING APPARATUS HAVING IMPROVED POLISHING LIQUID SUPPLYING APPARATUS, AND POLISHING LIQUID SUPPLYING METHOD

BACKGROUND OF THE INVENTION

The present invention relates to a chemical mechanical polishing (to be referred to as CMP hereinafter) technique for planarizing the surface of, e.g., a semiconductor wafer and, more particularly, to a supplying apparatus for supplying a liquid mixture containing a polishing agent and chemicals to a polishing pad, a supplying method thereof, and a semiconductor polishing apparatus and method employing this liquid mixture supplying apparatus or method.

In recent years, along with a trend for a higher packing density and finer micropatterning of semiconductor devices, various types of micropatterning techniques have been studied and developed. Among these techniques, the CMP technique is indispensable in planarization of an insulating interlayer film, formation of a plug, formation of a buried metal wire, isolation of buried elements, and the like.

FIG. 4 shows the schematic arrangement of a CMP apparatus used in the manufacture of a semiconductor device.

More particularly, a polishing table 101 can rotate in the direction of an arrow in FIG. 4 about a shaft 102 as the center. A polishing pad 103 is adhered to the upper surface of the polishing table 101. A wafer carrier 104 for holding a semiconductor wafer is arranged above the polishing table 101 at a position shifted from the center of the polishing table 101. The wafer carrier 104 can rotate in the direction of an arrow in FIG. 4 about a shaft 105 as the center.

The wafer carrier 104 is mounted on the shaft 105. The wafer carrier 104 has a diameter smaller than the radius of the polishing table 101 and, e.g., a vacuum chuck. A semiconductor wafer 106 is held by the lower surface of the wafer carrier 104 with vacuum chucking. The polishing surface of the semiconductor wafer 106 held by the wafer carrier 104 is urged with a predetermined pressure so as to come into contact with the surface of the polishing pad 103.

A tank 107 is arranged above the polishing table 101. The tank 107 stores a polishing liquid 109 adjusted in advance. The polishing liquid 109 in the tank 107 is supplied to the surface of the polishing pad 103 through a pump (P) 108 and a pipe 110. The distal end of the pipe 110 is arranged near the center of the polishing pad 103 and upstream a position where the semiconductor wafer 106 comes into contact with the polishing pad 103.

To polish a wafer with the CMP apparatus having the above arrangement, first, the polishing table 101 is constantly rotated in one direction at a predetermined rotation speed about the shaft 102 as the center. In this state, through the pipe 110, the polishing liquid 109 stored in the storage tank 107 is supplied upstream a position on the polishing table 101 where the semiconductor wafer 106 comes into contact with the polishing pad 103.

Thereafter, the wafer carrier 104 is moved downward while being constantly rotated in one direction at a predetermined rotation speed about the shaft 105 as the center, to cause the polishing surface of the semiconductor wafer 106 to come into contact with the polishing surface of the polishing pad 103 with a predetermined pressure. The polishing surface of the semiconductor wafer 106 is brought into slidable contact with the polishing surface of the polishing pad 103 through the polishing liquid 109, so that it is gradually polished and planarized.

In the CMP apparatus having the above arrangement, however, since the polishing liquid 109 adjusted in advance is stored in the tank 107 and is supplied from the tank 107 through the pipe 110, the following problems arise.

In the conventional CMP apparatus, a polishing liquid 109, which is obtained by suspending, e.g., polishing particles, in a solution, e.g., water, added with a chemical substance, is generally used. Therefore, as time passes, the polishing particles aggregate or are precipitated in the tank 107 to clog the pipe 110, or reaction or decomposition of the chemical substance proceeds exceedingly to change the properties of the polishing liquid 109.

For example, if the polishing liquid 109 is a mixture of $SiO_2$ having an average primary particle diameter (initial particle diameter) of about 0.05 $\mu$m and hydrogen peroxide, the average secondary particle diameter of initial $SiO_2$ stored in the tank 17 is about 0.3 $\mu$m. When a cumulative storage time of 0.5 hour has elapsed, the average secondary particle diameter of $SiO_2$ has grown to about 0.7 $\mu$m, and about 10% of polishing particles are precipitated. Accordingly, hydrogen peroxide having a comparatively high decomposition speed is wasted for about 10% a day.

Therefore, the pipe 110 must be prevented from clogging with the aggregated or precipitated polishing particles or the polishing liquid 109 must be prevented from being changed in properties by the reaction or decomposition of the chemical substance, and the polishing liquid 109 having a stable particle diameter and a stable concentration must always be supplied. For this purpose, the polishing liquid 109 may be exchanged often so that it will not be stored over a long period of time, or the polishing liquid 109 may be adjusted and stored in the tank 107 in batches of small amounts. However, this operation is cumbersome and is not practical. In addition, when the polishing liquid is exchanged often to maintain the stability of the polishing liquid 109, every time the operation is to be performed, the CMP apparatus must be stopped. This greatly degrades the operating efficiency of the CMP apparatus to interfere with an increase in manufacturing efficiency.

In order to solve these problems, a solution in which polishing particles are suspended and a solution added with a chemical substance may be separately supplied onto the polishing pad, and may be mixed on the polishing pad to generate the polishing liquid. In this case, however, the solution in which the polishing particles are suspended and the solution added with the chemical substance cannot be mixed sufficiently. Accordingly, it is difficult to supply a stable polishing liquid, and the uniformity in polishing is impaired due to the variations in concentration of the polishing liquid.

FIG. 5 schematically shows another CMP apparatus disclosed in U.S. Pat. No. 5,407,526.

In this CMP apparatus, a tank 202 stores a solution 201 in which polishing particles are suspended, and a tank 204 stores a solution 203 added with a chemical substance. The solution 201 pumped from the tank 202 with a pump 205 and supplied to a pipe 206 and the solution 203 pumped from the tank 204 with a pump 207 and supplied through a pipe 208 are mixed by a mixing unit 209. A polishing liquid 210 generated by the mixing unit 209 is supplied onto a polishing pad 103.

In the CMP apparatus having the above arrangement, the polishing liquid 210 is generated by the mixing unit 209, and thereafter it is supplied to the surface of the polishing pad 103. Therefore, a cumbersome operation for exchanging the polishing liquid is not required, thus improving operating efficiency. However, since the polishing liquid 210 is generated by the mixing unit 209, the polishing liquid 210 may stay in the mixing unit 209 undesirably. More specifically, in order to sufficiently mix the solutions 201 and 203, the diameter of the discharge port of the mixing unit 209 is smaller than the inner diameter of the mixing unit 209. Accordingly, the polishing liquid 210 stays in the mixing unit 209 to cause aggregation or precipitation of the polishing particles. As a result, the mixing unit 209 may clog, or a change in properties of the polishing liquid 210 due to the reaction or decomposition of the chemical substance cannot be prevented completely.

BRIEF SUMMARY OF THE INVENTION

It is the first object of the present invention to provide a liquid mixture supplying apparatus capable of preventing stay of a liquid mixture, clogging of the pipe caused by aggregation or precipitation of polishing particles, and a change in properties of the liquid mixture caused by the reaction or decomposition of the chemical substance, and a supplying method thereof.

It is the second object of the present invention to provide a semiconductor polishing apparatus and method employing a liquid mixture supplying apparatus or method capable of preventing clogging of the pipe caused by aggregation or precipitation of polishing particles, and a change in properties of the liquid mixture caused by the reaction or decomposition of the chemical substance.

The objects of the present invention described above are achieved by the following arrangements.

According to the present invention, there is provided a liquid mixture supplying apparatus comprising:

a first pipe having an outlet port to deliver a first solution containing polishing particles;

a second pipe having an outlet port to deliver a second solution containing a chemical substance; and a mixing unit having one end portion to which said outlet ports of said first and second pipes are connected, said mixing unit having the other end portion with an inner diameter substantially equal to an inner diameter of said one end portion thereof, to deliver, through the other end portion, a polishing liquid generated by mixing said first and second solutions, wherein said inner diameter of said one end portion of said mixing unit is set to substantially equal to a sum of inner diameters of said first and second pipes.

According to the present invention, there is also provided a liquid mixture supplying method comprising the steps of:

introducing a first solution containing polishing particles and a second solution containing a chemical substance to a mixing unit;

mixing the first and second solutions in the mixing unit, thereby generating a liquid mixture; and delivering the liquid mixture from the mixing unit, the liquid mixture being delivered at an outlet flow rate almost equal to those of the first and second solutions introduced into the mixing unit in the introducing step.

According to the present invention, there is also provided a polishing apparatus comprising:

a polishing table having a surface formed with a polishing pad;

a holder for holding an object to be polished which is brought into contact with said polishing pad, said holder moving relative to said polishing table;

a first accommodating portion for accommodating a first solution containing polishing particles;

a second accommodating portion for accommodating a second solution containing a chemical substance;

a first pipe having one end portion connected to said first accommodating portion;

a pump connected to an intermediate portion of said first pipe to deliver said first solution in said first accommodating portion;

a second pipe having one end portion connected to said second accommodating portion;

a liquid mass flow unit connected to an intermediate portion of said second pipe to control a flow rate of said second solution flowing in said second pipe; and a mixing unit having one end portion connected to the other end portion of each of said first and second pipes, said mixing unit having the other end portion with an inner diameter substantially equal to an inner diameter of said one end portion thereof, to deliver, through the other end portion, said first and second solutions that are mixed, wherein said inner diameter of said one end portion of said mixing unit is set to substantially equal to a sum of inner diameters of said first and second pipes.

According to the present invention, there is also provided a semiconductor substrate polishing method comprising the steps of:

introducing a first solution containing polishing particles and a second solution containing a chemical substance to a mixing unit;

mixing the first and second solutions in the mixing unit, thereby generating a liquid mixture; and delivering the liquid mixture from the mixing unit onto a polishing pad that polishes a semiconductor substrate, the liquid mixture being delivered at an outlet flow rate almost equal to those of the first and second solutions introduced into the mixing unit in the introducing step.

According to the liquid mixture supplying apparatus and its supplying method, and the semiconductor substrate polishing apparatus and its polishing method of the present invention, the liquid mixture can be supplied without stay. As a result, the liquid mixture can be supplied smoothly, so that clogging of the liquid mixture caused by aggregation or precipitation of the polishing particles, and a change in properties of the liquid mixture caused by the reaction or decomposition of the chemical substance can be prevented.

Additional object and advantages of the invention will be set forth in the description which follows, and in part will be obvious from the description, or may be learned by practice of the invention. The object and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 4 is a schematic diagram showing a conventional CMP apparatus; and

FIG. 5 is a schematic diagram showing another conventional CMP apparatus.

DETAILED DESCRIPTION OF THE INVENTION

The preferred embodiments of the present invention will be described with reference to the accompanying drawings.

Figure 1:
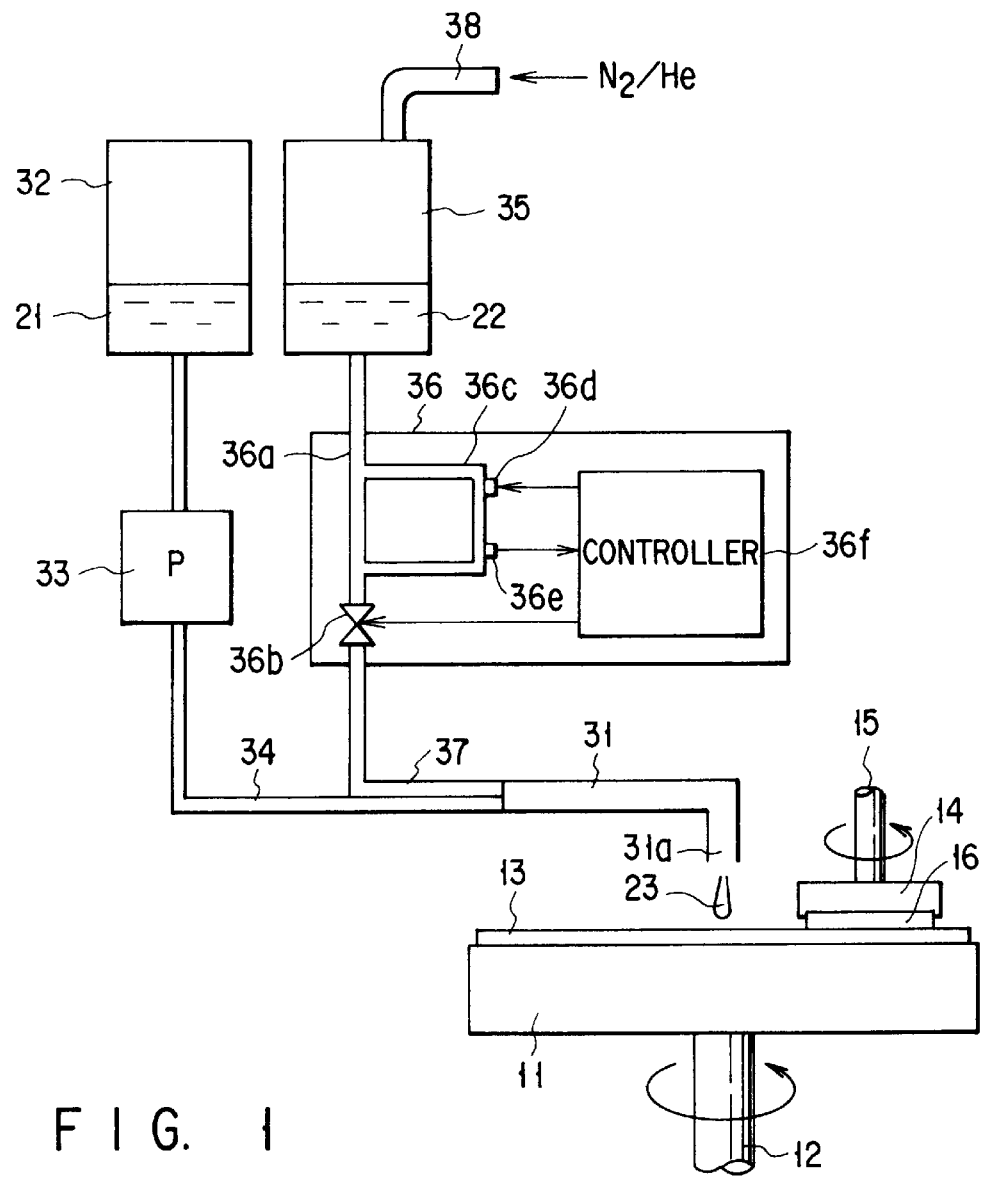
FIG. 1 is a diagram schematically showing a CMP apparatus according to the first embodiment of the present invention.

FIG. 1 shows the schematic arrangement of a CMP apparatus according to the first embodiment of the present invention.

A polishing table 11 has a radius of 600 mm or more, and can constantly rotate in the direction of an arrow in FIG. 1 usually at a rotation speed of 20 r.p.m. to 100 r.p.m. (200 r.p.m. at maximum) about a shaft 12 as the center. A polishing pad 13 is adhered to the upper surface of the polishing table 11. The polishing pad 13 is a flat plate-like polishing member and is made of, e.g., a synthetic fiber such as polyether-based polyurethane, polyester-based polyurethane, or polyamide-based polyurethane; an unwoven fabric or a woven fabric solidified with a synthetic resin; a foamed polyurethane resin having closed cells with a diameter of 10 $\mu$m to about several mm; or the like.

A wafer carrier 14 for holding a semiconductor wafer is arranged above the polishing table 11 at a position shifted from the center of the polishing table 11. The wafer carrier 14 has a radius of about 200 mm, and can constantly rotate in the direction of an arrow in FIG. 1 usually at a rotation speed of 20 r.p.m. to 100 r.p.m. (200 r.p.m. at maximum) about a shaft 15 as the center. The wafer carrier 14 has a vacuum chuck (not shown). A semiconductor wafer (semiconductor substrate) 16 as a polishing target object is held by the lower surface of the wafer carrier 14 with vacuum chucking. The wafer carrier 14 is vertically movable toward and away from the surface of the polishing table 11. When polishing it, the semiconductor wafer 16 held by the wafer carrier 14 is urged by the polishing pad usually with a pressure of 100 gf/cm$^2$ to 500 gf/cm$^2$ (1 kgf/cm$^2$ at maximum). The pressure during this urging can be controlled by compressed air supplied to an air cylinder (not shown) arranged to the shaft 15.

A first tank 32 storing a first solution 21 and a second tank 35 storing a second solution 22 are arranged above the polishing table 11. The first solution 21 is obtained by suspending polishing particles, e.g., Al$_2$O$_3$, in water. The second solution 22 is obtained by adding a chemical substance, e.g., hydrogen peroxide, in water. One end of a first pipe 34 is connected to the bottom portion of the first tank 32, and the other end of the first pipe 34 is connected to one end of a third pipe 31 that constitutes a mixing unit. A pump (P) 33 for delivering the first solution 21 in the first tank 32 is connected to an intermediate portion of the first pipe 34.

An inlet pipe 38 for introducing an inert gas, e.g., N$_2$ gas or He gas, is connected to the upper portion of the second tank 35. The second solution 22 in the second tank 35 is delivered from the second tank 35 in accordance with the pressure of this gas. One end of a second pipe 37 is connected to the bottom portion of the second tank 35. A liquid mass flow unit 36 is connected to the intermediate portion of the second pipe 37. The liquid mass flow unit 36 controls the flow rate of second solution 22 delivered from the second tank 35 to the second pipe 37 in accordance with the pressure of the gas.

The other end of each of the first and second pipes 34 and 37 is connected to one end of the third pipe 31. The other end of the third pipe 31 is arranged near the center of the polishing pad 13 and upstream a position where the semiconductor wafer 16 comes into contact with the polishing pad 13. The third pipe 31 generates a polishing liquid (slurry) 23 by mixing the first and second solutions 21 and 22 introduced through the first and second pipes 34 and 37, and supplies the polishing liquid 23 to the polishing pad 13.

The first pipe 34 has a diameter of, e.g., about ¼ inch, and can supply the first solution 21 delivered by the pump 33 to the third pipe 31 at a flow rate of about substantially 50 ml/min to several l/min. The second pipe 37 has a diameter of, e.g., about ¼ inch, and can supply the second solution 22 delivered by the liquid mass flow unit 36 to the third pipe 31 at a flow rate of about 5 ml/min to 20 ml/min.

The sectional area (diameter) of the pipe 31 is set to, e.g., about ½ inch which is larger than the sum of the sectional areas (diameters) of the first and second pipes 34 and 37. Accordingly, the third pipe 31 can deliver the polishing liquid 23 having a flow rate of about 50 ml/min to 500 ml/min with a flow velocity almost equal to the inlet flow velocities of the first and second solutions 21 and 22.

The third pipe 31 has a length of, e.g., 1 m or less, and the opening directions of the first and second pipes 34 and 37 coincide with the longitudinal direction of the third pipe 31.

The liquid mass flow unit 36 has a known arrangement, and has a first passage 36a communicating with the second pipe 37, a valve 36b connected to the first passage 36a, and a second passage 36c branching from the first passage 36a. A heat source 36d for supplying heat to the solution flowing through the second passage 36c, and a detector 36e for detecting the temperature of this solution are connected to the second passage 36c. The heat source 36d and the detector 36e are connected to a controller 36f. The controller 36f detects the flow rate of solution flowing through the first passage 36a in accordance with a specific heat detected by the detector 36e. The opening diameter of the valve 36b is controlled in accordance with the detected flow rate and a preset flow rate, thereby controlling the flow rate of solution flowing through the first passage 36a.

In this manner, when the flow rate of second solution 22 flowing through the second pipe 37 is controlled by the liquid mass flow unit 36, it can be controlled accurately. Pulsation does not occur in the solution delivered from the liquid mass flow unit 36, unlike in the solution delivered from the pump 33. Therefore, if the pressure of the N$_2$ gas or He gas is set to about 4 kg/cm$^2$, the flow rate of second solution 22 can be accurately controlled to about 5 ml/min. Since a small amount of solution can be controlled accurately in this manner, the second solution 22 can be used at a high concentration. As a result, the use amount of second solution 22 can be suppressed to decrease the frequency of replenishment.

When a second solution having a low concentration is used, the amount of second solution with respect to the amount of first solution must be increased in order to generate a polishing liquid having a predetermined concentration. In contrast to this, in this embodiment, since the second solution having a high concentration is used, when generating a polishing liquid having a predetermined concentration, the amount of second solution 22 with respect to the amount of first solution 21 can be decreased. As a result, a change in concentration of the entire polishing liquid can be prevented, thereby preventing variations in polishing.

Since the liquid mass flow unit 36 is employed, the flow rate of second solution 22 supplied into the second pipe 37 can be decreased. If the diameter of the second pipe 37 can be set smaller than that of the first pipe 34, the diameter of the third pipe 31 can be set to almost equal to that of the first pipe 34.

In this manner, when the diameter of the third pipe 31 is formed to be at least equal to that of the first or second pipe 34 or 37 or larger than that in accordance with the flow rates of first and second solutions 21 and 22 respectively supplied into the first and second pipes 34 and 37, the polishing liquid 23 can be supplied with a flow rate almost equal to the flow rates of the first and second solutions 21 and 22. As described above, the amount of second solution 22 is smaller than that of first solution 21. Hence, the flow velocity of polishing liquid 23 is almost equal to that of first solution 21.

In addition, if the inner diameter of the other end 31a of the third pipe 31 is equal to the inner diameter of its one end or larger than that, the polishing liquid 23 will not stay midway along the third pipe 31. Therefore, the polishing liquid 23 can be supplied onto the polishing pad 13 more smoothly, and clogging of the polishing liquid caused by aggregation or precipitation of polishing particles in the third pipe 31, or a change in properties of the polishing liquid caused by the reaction or decomposition of the chemical substance can be prevented.

A polishing method in the CMP apparatus having the above arrangement will be described. A case will be described wherein a tungsten film as a polishing target film is polished to form buried metal wirings.

The polishing table 11 is constantly rotated at a rotation speed of 20 r.p.m. to 100 r.p.m. The first solution 21 obtained by suspending in water $Al_2O_3$ polishing particles having an average primary particle diameter of about 0.05 μm is stored in the first tank 32, and the second solution 22 obtained by adding hydrogen peroxide to water is stored in the second tank 35. The first solution 21 stored in the first tank 32 is supplied to the third pipe 31 by the pump 33 at a flow rate of about 180 ml/min through the first pipe 34, and the second solution 22 stored in the second tank 35 is supplied to the third pipe 31 by the liquid mass flow unit 36 at a flow rate of about 20 ml/min through the second pipe 37. The first and second solutions 21 and 22 are mixed sufficiently in the third pipe 31 to generate the polishing liquid 23. The polishing liquid 23 is supplied from the other end 31a of the third pipe 31 onto the polishing pad 13 near its center of rotation and upstream a position where the semiconductor wafer 16 comes into contact with the polishing pad 13. At this time, the polishing liquid 23 is supplied from the other end 31a onto the polishing pad 13 while maintaining a flow rate (or flow velocity) substantially equal to the inlet flow rate (or flow velocity) of the first or second solution 21 or 22 without staying midway along the third pipe 31.

Figure 2A:
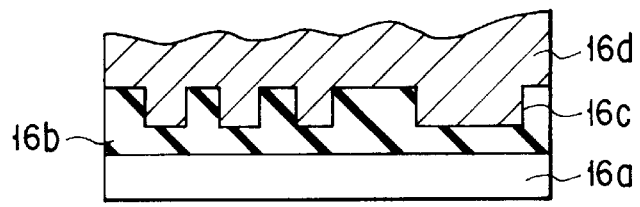
FIGS. 2A and 2B are schematic sectional views of a semiconductor wafer that explain a polishing method using the CMP apparatus shown in FIG. 1.

The semiconductor wafer 16 which is to be subjected to polishing is held by the lower surface of the wafer carrier 14. FIG. 2A shows a section of the semiconductor wafer 16. In this semiconductor wafer 16, a silicon dioxide film 16b serving as an insulating film is formed on, e.g., a silicon substrate 16a, to a thickness of about 1.3 μm by plasma CVD. Grooves 16c each having a width falling within a range of 0.3 μm to 1 μm and a depth of 0.4 μm are formed in the silicon dioxide film 16b in accordance with known lithography and etching. A tungsten film 16d having a thickness of 0.8 μm is formed on the silicon dioxide film 16b by means of thermal CVD to fill the grooves 16c.

Figure 2B:
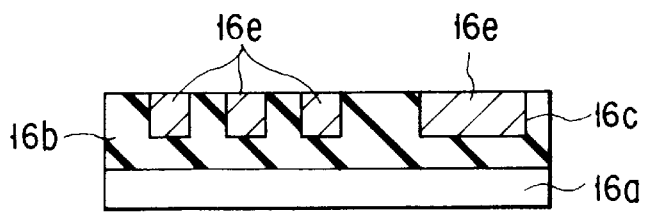

The wafer carrier 14 is moved downward while it is constantly rotated at a rotation speed of 20 r.p.m. to 100 r.p.m. and urges the polishing target surface of the semiconductor wafer 16 at a pressure of about 300 gf/cm² to bring it into contact with the polishing surface of the polishing pad 13. In this manner, the semiconductor wafer 16 held by the wafer carrier 14 is polished. More specifically, while the polishing liquid 23 is present between the polishing pad 13 and the semiconductor wafer 16, the polishing surface of the semiconductor wafer 16 is brought into slidable contact with the polishing surface of the polishing pad 13. Therefore, the tungsten film 16d is gradually polished and planarized. As a result, as shown in FIG. 2B, the tungsten film 16d existing at portions of the polishing target surface other than in the grooves 16c is entirely removed from the silicon dioxide film 16b, thereby forming buried tungsten wirings 16e.

After polishing is performed for a predetermined period of time in this manner, the wafer carrier 14 is moved upward to separate the semiconductor wafer 16 from the polishing pad 13, thus completing polishing.

The average secondary particle diameter of the $Al_2O_3$ polishing particles of the polishing liquid 23 used in this polishing was about 0.3 μm even after the first solution 21 was stored in the first tank 32 for about a month. Hydrogen peroxide of the second solution 22, after the second solution 22 was stored in the second tank 35 for about a month, was decomposed by about 2%. Therefore, the stability of the polishing liquid 23 can be maintained easily, so the polishing liquid 23 need not be exchanged often. As a result, the operating efficiency of the CMP apparatus is increased, thereby improving the manufacturing efficiency.

As described above, in this embodiment, the polishing liquid 23 is delivered through the other end 31a having an inner-diameter area equal to that of one end side of the third pipe 31 or larger than that. Since the polishing liquid 23 can accordingly be delivered without staying in the third pipe 31, it can be supplied smoothly. Since the sufficiently mixed polishing liquid 23 can be supplied stably, variations in polishing rate can be suppressed. In addition, aggregation or precipitation of the polishing particles, or reaction or decomposition of the chemical substance, each of which is caused by stay of the polishing liquid 23, can be prevented. As a result, clogging or a change in properties of the polishing liquid 23 can be prevented, so that the polishing surface of the semiconductor wafer 16 can always be polished uniformly with excellent flatness.

In the above embodiment, the third pipe 31 is used in generation and supply of the polishing liquid 23. However, the present invention is not limited to this.

Figure 3A:
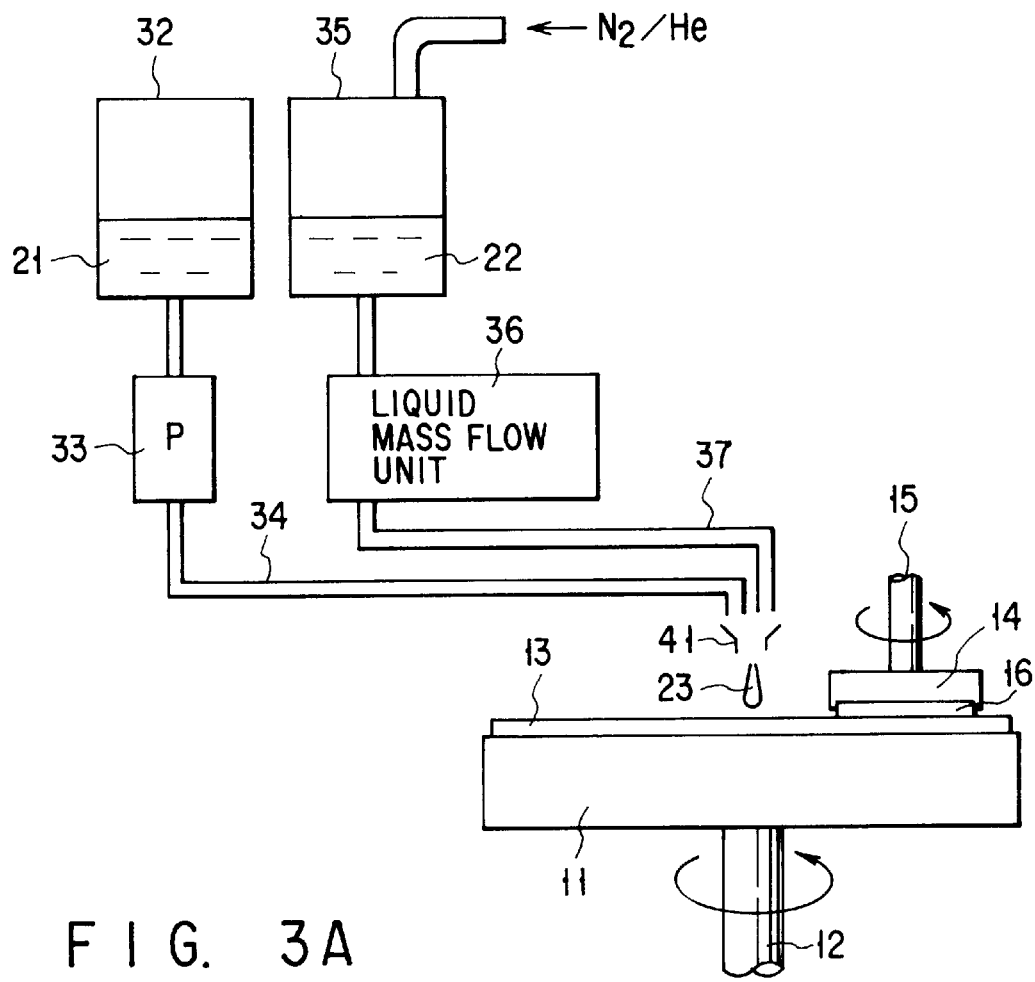
FIG. 3A is a diagram schematically showing a CMP apparatus according to the second embodiment of the present invention.

FIG. 3A shows the second embodiment of the present invention. In FIG. 3A, a funnel 41 is used in place of the third pipe 31. The outlet portion of the funnel 41 has an inner diameter equal to or greater than the sum of the diameters of first or second pipes 34 and 37, which are identical to those described above. The inlet portion of the funnel 41 has an inner diameter equal to or greater than the inner-diameter of the outlet portion.

The funnel 41 having the above arrangement, a polishing liquid 23 can be deliver without staying in the funnel 41.

Since the sufficiently mixed polishing liquid 23 can be stably supplied accordingly, variations in polishing rate can be prevented. In addition, aggregation or precipitation of the polishing particles, or reaction or decomposition of the chemical substance, each of which is caused by stay of the polishing liquid 23, can be prevented. As a result, clogging or a change in properties of the polishing liquid 23 can be prevented, so that the polishing surface of the semiconductor wafer 16 can always be polished uniformly with excellent flatness.

Figure 3B:
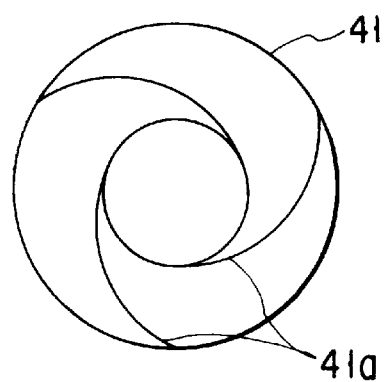
FIG. 3B is a plan view showing a modification of a funnel shown in FIG. 3A.

As shown in FIG. 3B, if channels 41a comprising helical projecting or recessed portions are formed inside the funnel 41 to promote agitation of first and second solutions 21 and 22, a sufficiently mixed polishing liquid 23 can be supplied. Helical channels may similarly formed on the inner surface of the third pipe 31.

The polishing particles are not limited to $Al_2O_3$, but $SiO_2$, $CeO_2$, SiN, or the like may be employed as the material of the polishing particles.

The chemical substance is not limited to hydrogen peroxide, but a surfactant for preventing aggregation of a slurry, acid, base, or the like may be employed as the chemical substance.

The present invention can be applied not only to formation of buried metal wirings, but also to planarization of an insulating interlayer film, formation of a plug, isolation of buried elements, and the like similarly.

The present invention can be applied not only to polishing of a tungsten film as a polishing target film, but also to polishing of Ti, TiN, Al, Cu, Ag, Au, polysilicon, SiN, $SiO_2$, and the like.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalent.

We claim:

1. A polishing apparatus comprising:

a polishing table having a surface formed with a polishing pad;

a holder for holding an object to be polished which is brought into contact with said polishing pad, said holder moving relative to said polishing table;

a first accommodating portion for accommodating a first solution containing polishing particles;

a second accommodating portion for accommodating a second solution containing a chemical substance;

a first pipe having one end portion connected to said first accommodating portion;

a pump connected to an intermediate portion of said first pipe to deliver said first solution in said first accommodating portion;

a second pipe having one end portion connected to said second accommodating portion;

a liquid mass flow unit connected to an intermediate portion of said second pipe to control a flow rate of said second solution flowing in said second pipe; and a mixing unit having one end portion connected to the other end portion of each of said first and second pipes, said mixing unit having the other end portion with an inner diameter substantially equal to an inner diameter of said one end portion thereof, to deliver, through the other end portion, said first and second solutions that are mixed, wherein said inner diameter of said one end portion of said mixing unit is set to substantially equal to a sum of inner diameters of said first and second pipes.

2. An apparatus according to claim 1, wherein the flow rate of a polishing liquid leaving said mixing unit is substantially equal to a sum of flow rates of said first and second solutions supplied thereto.

3. An apparatus according to claim 1, wherein said mixing unit comprises a third pipe having one and the other end portions with inner diameters that are substantially equal to each other.

4. An apparatus according to claim 1, wherein said mixing unit comprises a funnel having one and the other end portions, said other end portions having an inner-diameter substantially equal to the sum of the diameters of the first and second pipes, and said one end portion having an inner-diameter not less than the minimum inner-diameter of said other end portion.

5. An apparatus according to claim 4, wherein said funnel has a helical channel.

6. An apparatus according to claim 1, wherein the flow rate of said second solution delivered from said second pipe is substantially one tenth a flow rate of said first solution delivered from said first pipe.

7. An apparatus according to claim 1, further comprising an introducing unit, connected to said second accommodating portion, for introducing a gas into said second accommodating portion in order to deliver said second solution.

8. A polishing apparatus comprising:

a polishing table having a surface formed with a polishing pad;

a holder for holding an object to be polished which is brought into contact with said polishing pad, said holder moving relative to said polishing table;

a first accommodating portion for accommodating a first solution containing polishing particles;

a second accommodating portion for accommodating a second solution containing a chemical substance;

a first pipe having a first end and a second end, said first end connected to said first accommodating portion;

a pump connected to an intermediate portion of said first pipe to deliver said fire solution in said first accommodating portion;

a second pipe having a first end and a second end, said first end connected to said second accommodating portion;

a liquid mass flow unit connected to an intermediate portion of said second pipe to control a flow rate of said second solution flowing in said second pipe; and a mixing unit having a first end and a second end, said first end connected to the respective second ends of said first and second pipes, and said second end of the mixing unit supplying said first and second solutions to said polishing pad, wherein the inner diameter of said first end of the mixing unit is substantially equal to a sum of the inner diameters of said second ends of said first and second pipes, and the flow rate of the second solution is less than that of the first solution.

9. An apparatus according to claim 8, wherein the flow rate of said second solution delivered from said second pipe is substantially one tenth a flow rate of said first solution delivered from said first pipe.

10. An apparatus according to claim 8, further comprising an introducing unit, connected to said second accommodating portion, for introducing a gas into said second accommodating portion in order to deliver said second solution.

11. A polishing apparatus comprising:
- a polishing table having a surface formed with a polishing pad;
- a holder for holding an object to be polished which is brought into contact with said polishing pad, said holder moving relative to said polishing table;
- a first accommodating portion for accommodating a first solution containing polishing particles;
- a second accommodating portion for accommodating a second solution containing a chemical substance, a concentration of said second solution being higher than that of the first solution;
- a first pipe having a first end and a second end, said first end connected to said first accommodating portion;
- a pump connected to an intermediate portion of said first pipe to deliver said first solution in said first accommodating portion;
- a second pipe having a first end and a second end, said first end connected to said second accommodating portion;
- a liquid mass flow unit connected to an intermediate portion of said second pipe to control a flow rate of said second solution flowing in said second pipe; and
- a mixing unit having a first end and a second end, said first end connected to the respective second ends of said first and second pipes, and said second end of the mixing unit supplying said first and second solutions to said polishing pad, wherein the inner diameter of said first end of the mixing unit is substantially equal to a sum of the inner diameters of said second ends of said first and second pipes.

12. A polishing apparatus comprising:
- a polishing table having a surface formed with a polishing pad;
- a holder for holding an object to be polished which is brought into contact with said polishing pad, said holder moving relative to said polishing table;
- a first accommodating portion for accommodating a first solution containing polishing particles;
- a second accommodating portion for accommodating a second solution containing a chemical substance, and having a concentration of said second solution which is higher than that of the first solution;
- a supplier, connected to said second accommodating portion, for supplying an inert gas to said second accommodating portion;
- a first pipe having a first end and a second end, said first end connected to said first accommodating portion;
- a pump connected to an intermediate portion of said first pipe to deliver said first solution in said first accommodating portion;
- a second pipe having a first end and a second end, said first end connected to said second accommodating portion;
- a liquid mass flow unit connected to an intermediate portion of said second pipe to control a flow rate of said second solution flowing in said second pipe; and
- a mixing unit having a first end and a second end, said first end connected to the respective second ends of said first and second pipes, and said second end of the mixing unit supplying said first and second solutions to said polishing pad, wherein the inner diameter of said first end of the mixing unit is substantially equal to a sum of the inner diameters of said second ends of said first and second pipes.

* * * * *